(12) United States Patent
Hsu et al.

(10) Patent No.: US 11,133,447 B2
(45) Date of Patent: Sep. 28, 2021

(54) MICRO LIGHT-EMITTING DEVICE, STRUCTURE, AND DISPLAY THEREOF

(71) Applicant: PlayNitride Display Co., Ltd., MiaoLi County (TW)

(72) Inventors: Kuang-Yuan Hsu, MiaoLi County (TW); Chien-Chih Yen, MiaoLi County (TW); Yen-Lin Lai, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 16/669,525

(22) Filed: Oct. 31, 2019

(65) Prior Publication Data
US 2020/0350473 A1 Nov. 5, 2020

(30) Foreign Application Priority Data

Apr. 30, 2019 (TW) .................................. 108115004

(51) Int. Cl.
*H01L 33/58* (2010.01)
(52) U.S. Cl.
CPC .................................. *H01L 33/58* (2013.01)
(58) Field of Classification Search
CPC .................................. G02B 6/42; H01L 33/58
See application file for complete search history.

(56) References Cited

U.S. PATENT DOCUMENTS

| | | | |
|---|---|---|---|
| 7,018,859 B2 | 3/2006 | Liao et al. | |
| 2005/0287687 A1 | 12/2005 | Liao et al. | |
| 2012/0049226 A1* | 3/2012 | Jeong | H01L 33/44 257/98 |
| 2014/0246648 A1* | 9/2014 | Im | H01L 33/382 257/13 |
| 2014/0361321 A1 | 12/2014 | Saito et al. | |

FOREIGN PATENT DOCUMENTS

| | | |
|---|---|---|
| CN | 107437542 | 12/2017 |
| CN | 206976385 | 2/2018 |
| JP | 2013168547 | 8/2013 |
| KR | 20130139017 | 12/2013 |
| KR | 20160032977 | 3/2016 |
| WO | 2013077619 | 5/2013 |

OTHER PUBLICATIONS

Office Action of China Counterpart Application, dated Apr. 2, 2021, pp. 1-9.

* cited by examiner

*Primary Examiner* — Jay C Chang
*Assistant Examiner* — Mikka Liu
(74) *Attorney, Agent, or Firm* — JCIPRNET

(57) ABSTRACT

A micro light-emitting device includes an epitaxial structure layer, a first-type electrode, a second-type electrode, and a light guide structure. The epitaxial structure layer has a top surface and a bottom surface opposite to each other and a plurality of first grooves located on the top surface. The first-type electrode and the second-type electrode separated from each other are disposed on the epitaxial structure layer and located at the bottom surface. The light guide structure is disposed on the epitaxial structure layer. The light guide structure covers a portion of the top surface and a portion of inner walls of the first grooves to define a plurality of second grooves corresponding to the portion of the first grooves.

23 Claims, 12 Drawing Sheets

MICRO LIGHT-EMITTING DEVICE, STRUCTURE, AND DISPLAY THEREOF

CROSS-REFERENCE TO RELATED APPLICATION

This application claims the priority benefit of Taiwan patent application serial no. 108115004, filed on Apr. 30, 2019. The entirety of the above-mentioned patent application is hereby incorporated by reference herein and made a part of specification.

BACKGROUND OF THE INVENTION

Field of the Invention

The invention relates to a semiconductor device, and more particularly, to a micro light-emitting device, a micro light-emitting device structure, and a micro light-emitting device display.

Description of Related Art

At present, the transfer of micro light-emitting diodes involves transferring micro light-emitting diodes on a carrier substrate onto a receiving substrate mainly by means of electrostatic force or magnetic force, etc. Generally, the micro light-emitting diodes are held by a holding structure, so that the micro light-emitting diodes are more easily picked up from the carrier substrate and transported and transferred onto the receiving substrate, and the micro light-emitting diodes are stabilized by the holding structure such that quality is not affected by other external factors during transfer. In addition, a portion of the holding structure is usually in contact with the micro light-emitting diodes and remains on the transferred micro light-emitting diodes. Since the holding structure of this portion is mostly disposed on a light-emitting surface of the micro light-emitting diodes, and because of the material characteristics of the holding structure, the holding structure of this portion is regarded as a light guide structure. Therefore, how to improve the light-emitting efficiency of the micro light-emitting device under the existing architecture has become one of the objects of the industry.

SUMMARY OF THE INVENTION

The invention provides a micro light-emitting device, wherein a light guide structure thereof has second grooves corresponding to a portion of first grooves of an epitaxial structure layer to improve light-emitting efficiency.

The invention provides a micro light-emitting device structure, wherein a light guide portion of a holding structure thereof has second grooves corresponding to a portion of first grooves of the micro light-emitting device to improve the light-emitting efficiency of the micro light-emitting device.

The invention provides a micro light-emitting device display having better display quality.

A micro light-emitting device of the invention includes an epitaxial structure layer, a first-type electrode, a second-type electrode, and a light guide structure. The epitaxial structure layer has a top surface and a bottom surface opposite to each other and a plurality of first grooves located on the top surface. The first-type electrode is disposed on the epitaxial structure layer and located at the bottom surface. The second-type electrode and the first-type electrode are separated from each other, and the second-type electrode is disposed on the epitaxial structure layer and located at the bottom surface. The light guide structure is disposed on the epitaxial structure layer. The light guide structure covers a portion of the top surface and a portion of inner walls of the first grooves to define a plurality of second grooves corresponding to the portion of the first grooves.

In an embodiment of the invention, the epitaxial structure layer includes a first-type semiconductor layer, a second-type semiconductor layer, and a light-emitting layer. The first-type semiconductor layer is electrically connected to the first-type electrode, and the first-type semiconductor layer has a top surface. The second-type semiconductor layer is electrically connected to the second-type electrode. The light-emitting layer is located between the first-type semiconductor layer and the second-type semiconductor layer, wherein the top surface of the first-type semiconductor layer is relatively far from the light-emitting layer.

In an embodiment of the invention, the top surface of the first-type semiconductor layer has a central region and a peripheral region surrounding the central region, and a coverage of the light guide structure in the peripheral region is greater than a coverage of the light guide structure in the central region.

In an embodiment of the invention, a ratio of a depth of each of the first grooves to a thickness of the first-type semiconductor layer is greater than or equal to 0.05 and less than or equal to 0.3.

In an embodiment of the invention, the light guide structure has a first surface and a second surface opposite to each other. The first surface is in contact with the first-type semiconductor layer, and a root mean square roughness (Rq) of the first surface is greater than a root mean square roughness of the second surface.

In an embodiment of the invention, the top surface of the first-type semiconductor layer has a first portion and a second portion. The light guide structure is in contact with the first portion, and a root mean square roughness of the second portion is greater than a root mean square roughness of the first portion.

In an embodiment of the invention, a ratio of a depth of each of the first grooves to an emission wavelength of the micro light-emitting device is between 0.5 and 3. A ratio of a width of each of the first grooves to the emission wavelength of the micro light-emitting device is between 0.5 and 4. A ratio of a spacing between any two adjacent first grooves to the emission wavelength of the micro light-emitting device is between 1 and 5.

In an embodiment of the invention, a first depth of each of the first grooves is greater than a second depth of each of the corresponding second grooves. A first width of each of the first grooves is greater than a second width of each of the corresponding second grooves.

In an embodiment of the invention, a first depth of each of the first grooves and a second depth of each of the corresponding second grooves are both greater than or equal to 10 nm and less than or equal to 1500 nm.

In an embodiment of the invention, a first width of each of the first grooves and a second width of each of the corresponding second grooves are both greater than or equal to 250 nm and less than or equal to 2.5 microns.

In an embodiment of the invention, a first spacing of any two adjacent first grooves and a second spacing of any two adjacent second grooves are both less than or equal to 2.5 microns and greater than or equal to 0.5 microns.

In an embodiment of the invention, a cross-sectional shape of each of the first grooves includes an arc shape, a cone shape, or a platform shape.

In an embodiment of the invention, depths of adjacent first grooves are different.

In an embodiment of the invention, the top surface has a central region and a peripheral region surrounding the central region. A distribution density of the first grooves in the central region of the top surface is greater than a distribution density thereof in the peripheral region.

In an embodiment of the invention, the second grooves are conformally disposed with the corresponding first grooves.

In an embodiment of the invention, a first depth of each of the first grooves has a progressive change in a direction, and a second depth of each of the corresponding second grooves has the progressive change along the direction.

In an embodiment of the invention, a rate of the progressive change is large than 0% and less or equal to 10%.

In an embodiment of the invention, a first width of each of the first grooves has a progressive change in a direction, and a second width of each of the corresponding second grooves has the progressive change along the direction.

In an embodiment of the invention, a rate of the progressive change is large than 0% and less or equal to 10%.

A micro light-emitting device structure of the invention includes a substrate, at least one micro light-emitting device, and at least one holding structure. The micro light-emitting device is disposed on the substrate and has a top surface and a bottom surface opposite to each other, a plurality of first grooves located at the top surface, and a first-type electrode and a second-type electrode located at the bottom surface and separated from each other. The holding structure includes a light guide portion and a holding portion. The light guide portion is disposed on the micro light-emitting device. The light guide portion covers a portion of the top surface and a portion of inner walls of the first grooves to define a plurality of second grooves corresponding to the portion of the first grooves. The holding portion is connected to the light guide portion and extended onto the substrate.

A micro light-emitting device display of the invention includes a circuit substrate and at least one micro light-emitting device. The micro light-emitting device is disposed on the circuit substrate, and the micro light-emitting device includes an epitaxial structure layer, a first-type electrode, a second-type electrode, and a light guide structure. The epitaxial structure layer has a top surface and a bottom surface opposite to each other and a plurality of first grooves located at the top surface. The first-type electrode is disposed on the epitaxial structure layer and located at the bottom surface, wherein the first-type electrode is electrically connected to the circuit substrate. The second-type electrode and the first-type electrode are separated from each other, and the second-type electrode is disposed on the epitaxial structure layer and located at the bottom surface. The second-type electrode is electrically connected to the circuit substrate. The light guide structure is disposed on the epitaxial structure layer. The light guide structure covers a portion of the top surface and a portion of inner walls of the first grooves to define a plurality of second grooves corresponding to the portion of the first grooves.

Based on the above, in the design of the micro light-emitting device of the invention, the light guide structure has the second grooves corresponding to a portion of the first grooves of the epitaxial structure layer. With this design, the light-emitting efficiency of the micro light-emitting device may be effectively improved, and the display quality of the micro light-emitting device display using the micro light-emitting device may be improved. In addition, in the holding structure of the micro light-emitting device structure of the invention, the light guide portion is disposed on the micro light-emitting device and covers a portion of the top surface and the inner walls of a portion of the first grooves to define the second grooves corresponding to the portion of the first grooves, thereby increasing the light-emitting efficiency of the micro light-emitting device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Embodiments of the invention describe the structure of a micro light-emitting device (such as a micro LED) that is ready to be picked up and transferred onto a receiving substrate. The receiving substrate may be, for example, a display substrate, a light-emitting substrate, a substrate having functional devices such as transistors or integrated circuits (ICs), or other substrates having other circuits, but is not limited thereto. Although some embodiments of the invention are specific to describing a micro LED including a p-n diode, it should be understood that the embodiments of the invention are not limited thereto, and certain embodiments may also be applied to other micro light-emitting devices, and such micro light-emitting devices are designed in such a way as to control the execution of predetermined electronic functions (e.g., diodes, transistors, integrated circuits) or photonic functions (LEDs, lasers).

Figure 1:
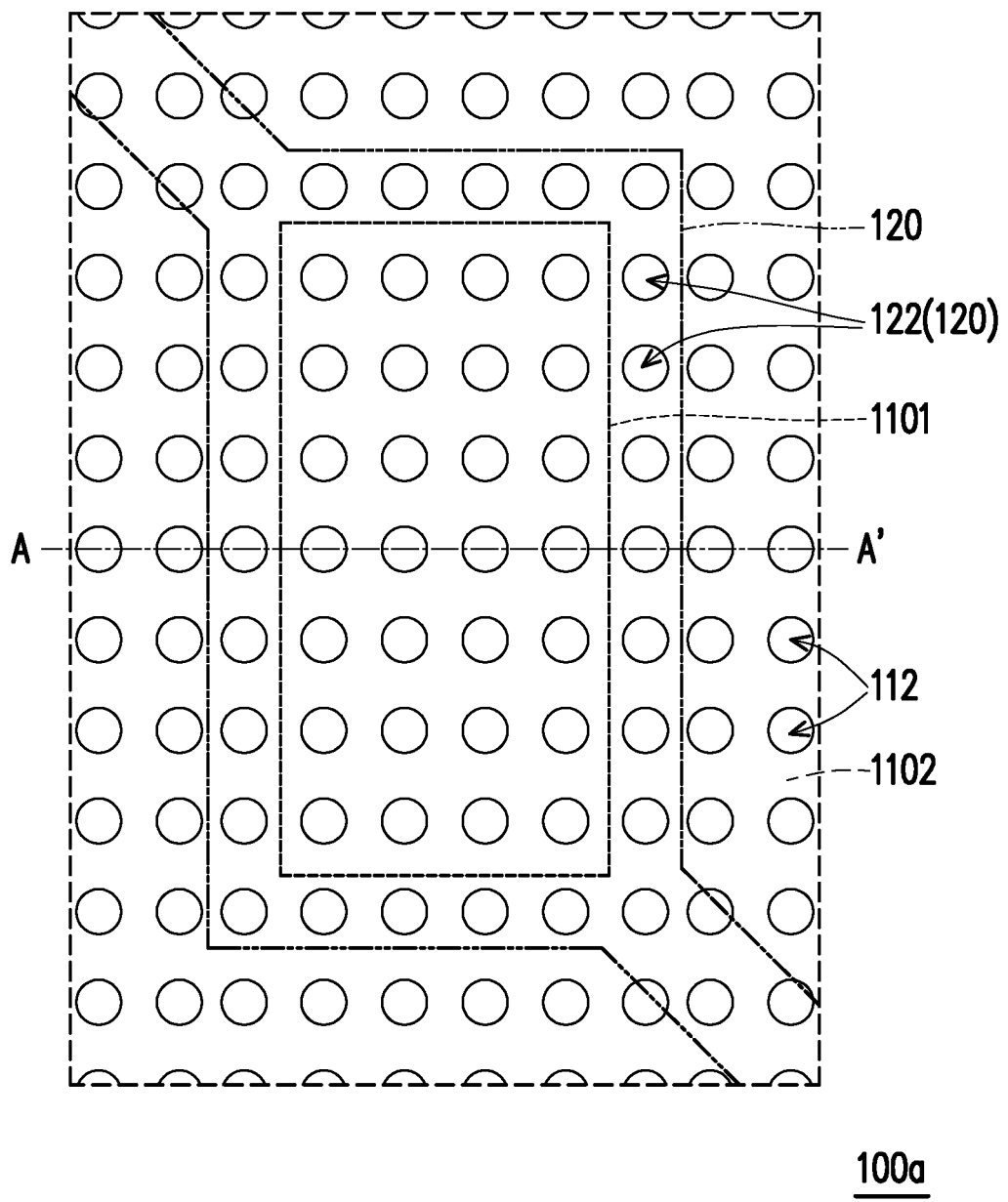
FIG. 1 is a top view of a micro light-emitting device of an embodiment of the invention.
Figure 2A:
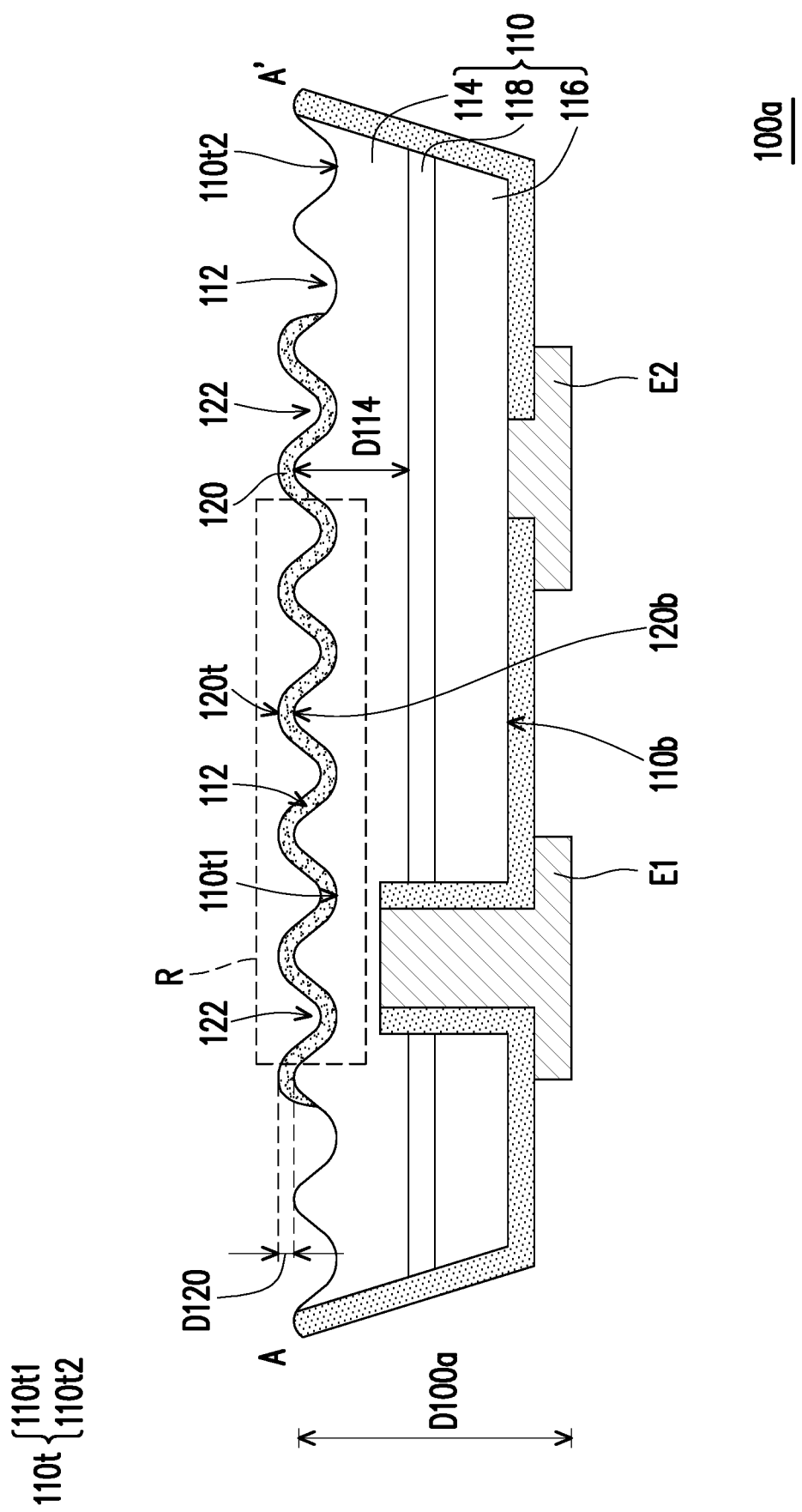
FIG. 2A is a cross section of the micro light-emitting device of FIG. 1 along line A-A'.
Figure 2B:
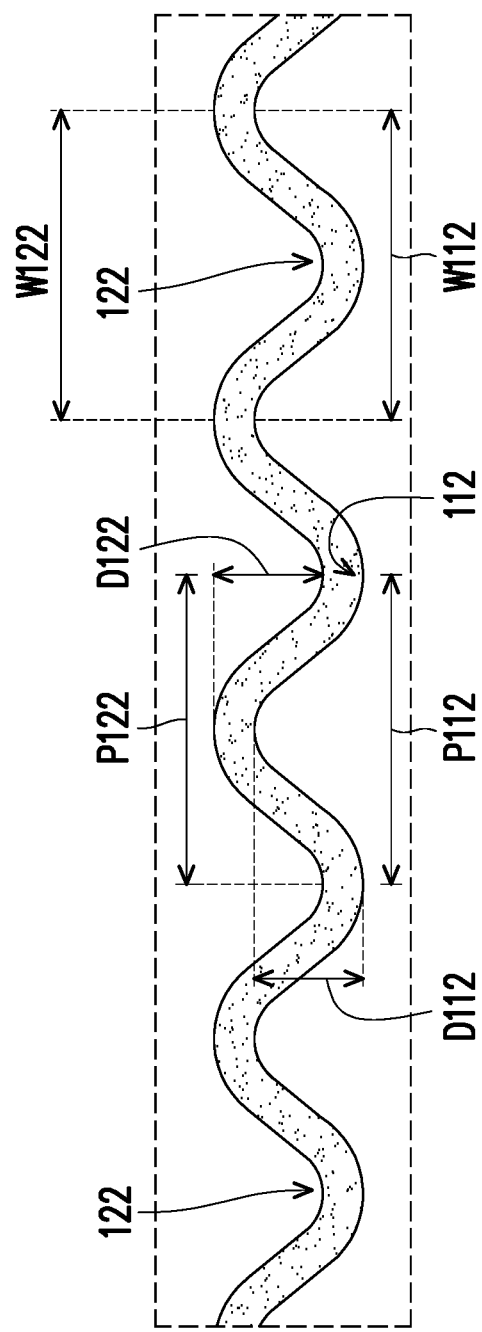
FIG. 2B is an enlarged view of a region R of the micro light-emitting device of FIG. 2A.

FIG. 1 is a top view of a micro light-emitting device of an embodiment of the invention. FIG. 2A is a cross section of the micro light-emitting device of FIG. 1 along line A-A'. FIG. 2B is an enlarged view of a region R of the micro light-emitting device of FIG. 2A.

Referring first to FIG. 1 and FIG. 2A simultaneously, a micro light-emitting device 100a of the present embodiment includes an epitaxial structure layer 110, a first-type electrode E1, a second-type electrode E2, and a light guide structure 120. The epitaxial structure layer 110 has a top surface 110t and a bottom surface 110b opposite to each other and a plurality of first grooves 112 located on the top surface 110t. The first-type electrode E1 and the second-type electrode E2 are both disposed on the epitaxial structure layer 110 and located on the bottom surface 110b, wherein the first-type electrode E1 and the second-type electrode E2 are separated from each other. The light guide structure 120 is disposed on the epitaxial structure layer 110 and covers a portion of the top surface 110t and a portion of inner walls of the first grooves 112 to define a plurality of second grooves 122 corresponding to the portion of the first grooves 112. Preferably, the second grooves 122 are conformally disposed with the corresponding first grooves 112. Via the design of the first grooves 112 and the second grooves 122, the light-emitting efficiency of the micro light-emitting device 100a may be effectively improved.

Specifically, referring to FIG. 2A, in the micro light-emitting device 100a, the epitaxial structure layer 110 includes a first-type semiconductor layer 114, a second-type semiconductor layer 116, and a light-emitting layer 118. Herein, the first-type semiconductor layer 114 may be an N-type semiconductor, and the second-type semiconductor layer 116 may be a P-type semiconductor, but the invention is not limited thereto. The first-type semiconductor layer 114 is electrically connected to the first-type electrode E1, and the first-type semiconductor layer 114 has the top surface 110t. The second-type semiconductor layer 116 is electrically connected to the second-type electrode E2, and the second-type semiconductor layer 116 has the bottom surface 110b. The light-emitting layer 118 is located between the first-type semiconductor layer 114 and the second-type semiconductor layer 116, and the top surface 110t of the first-type semiconductor layer 114 is relatively far from the light-emitting layer 118. Herein, the micro light-emitting element 100a is embodied as a flip-chip micro light-emitting device, but the invention is not limited thereto.

Referring again to FIG. 1 and FIG. 2A simultaneously, the ratio of the orthographic projection area of the light guide structure 120 of the micro light-emitting device 100a on the first-type semiconductor layer 114 to the area of the first-type semiconductor layer 114 is preferably greater than 0.5 and less than 1, which may effectively improve the light-emitting efficiency of the micro light-emitting device 100a. Herein, the first-type semiconductor layer 114 of the micro light-emitting device 100a has a central region 1101 at the top surface 110t and a peripheral region 1102 surrounding the central region 1101, wherein the distribution density of the first grooves 112 in the central region 1101 is approximately equal to the distribution density in the peripheral region 1102. Herein, the ratio of the central region 1101 in the top surface 110t is greater than 0.5 and less than 1, but is not limited thereto.

Furthermore, referring to FIG. 2A and FIG. 2B simultaneously, in the micro light-emitting device 100a of the present embodiment, depths D112 of adjacent first grooves 112 is substantially the same, but the invention is not limited thereto. In other embodiments not shown, the depths of adjacent first grooves may also be different. Preferably, the ratio of the depth D112 of the first grooves 112 to a thickness D114 of the first-type semiconductor layer 114 is greater than or equal to 0.05 and less than or equal to 0.3. If the above ratio is too large (i.e., the depth D112 of the first grooves 112 is too great), the production yield of the micro light-emitting device 100a is reduced. On the other hand, if the above ratio is too small (that is, the depth D112 of the first grooves 112 is too small), the light-emitting efficiency of the micro light-emitting device 100a may be poor. It should be noted that, in the present embodiment, the cross-sectional shape of the first grooves 112 of the micro light-emitting device 100a is, for example, an arc shape, but in other embodiments not shown, the cross-sectional shape of the first grooves 112 may also be other suitable shapes, such as a cone shape, a platform shape, or a combination thereof, and the invention is not limited thereto.

More specifically, the ratio of the depth D112 of the first grooves 112 of the present embodiment to the emission wavelength of the micro light-emitting device 100a is, for example, between 0.5 and 3, the ratio of a width W112 of the first grooves 112 to the emission wavelength of the micro light-emitting device 100a is between 0.5 and 4, and when the ratio of a spacing P112 between any two adjacent first grooves 112 to the emission wavelength of the micro light-emitting device 100a is between 1 and 5, good light-emitting efficiency may be achieved. If the above ratio range is exceeded, the light-emitting efficiency of the micro light-emitting device 100a is reduced, even making light emission impossible. Specifically, in an embodiment, if the micro light-emitting device 100a is a blue micro light-emitting diode, preferably, the ratio of the depth D112 of the first grooves 112 to blue light wavelength is greater than 0.5 and less than 3, the ratio of the width W112 of the first grooves 112 to blue light wavelength is greater than 1 and less than 4, and the ratio of the spacing P112 between any two adjacent first grooves 112 to blue light wavelength is between 1 and 5. In an embodiment, if the micro light-emitting device 100a is a green micro light-emitting diode, the ratio of the depth D112 of the first grooves 112 to green light wavelength is greater than 0.5 and less than 2.5, the ratio of the width W112 of the first grooves 112 to green light wavelength is greater than 0.5 and less than 3.5, and the ratio of the spacing P112 between any two adjacent first grooves 112 to green light wavelength is greater than 1 and less than 4.

Referring further to FIG. 2A and FIG. 2B, the first grooves 112 of the micro light-emitting device 100a have the first depth D112, and the corresponding second grooves 122 have the second depth D122. In the present embodiment, the first depth D112 of the first grooves 112 is equal to the second depth D122 of the corresponding second grooves 122, that is, the light guide structure 120 has a uniform thickness, so that light emission is more uniform. Herein, the first depth D112 of the first grooves 112 and the second depth D122 of the second grooves 122 are both nanometers, for example, greater than or equal to 10 nm and less than or equal to 1500 nm, which may make the micro light-emitting device 100a have better light-emitting efficiency. If the first depth D112 of the first grooves 112 and the second depth D122 of the second grooves 122 are respectively greater than 1500 nm, or less than 10 nm, the light generated by the light-emitting layer 118 may be confined and not come out.

Moreover, the first grooves 112 of the present embodiment have the first width W112, and the corresponding second grooves 122 have the second width W122. In the present embodiment, the first width W112 of the first grooves 112 is equal to the second width W122 of the corresponding second grooves 122. Preferably, the first width W112 of the first grooves 112 and the second width W122 of the second grooves 122 are both nanometers, for example, when both are greater than or equal to 250 nm and less than or equal to 2.5 microns, the light-emitting efficiency of the micro light-emitting device 100a may be improved. If the first width W112 of the first grooves 112 and the second width W122 of the second grooves 122 are both respectively greater than 2.5 microns, or less than 250 nm, crystal defects may be increased and the production yield of the micro light-emitting device 100a may be reduced. In addition, any two adjacent first grooves 112 have the first spacing P112, and any two corresponding connected second grooves 122 have the second spacing P122. Herein, the first spacing P112 and the second spacing P122 are both, for example, less than or equal to 2.5 microns and greater than or equal to 0.5 microns, such that the light-emitting efficiency of the micro light-emitting device 100a may be improved. If the first spacing P112 and the second spacing P122 are both respectively greater than 2.5 microns, or less than 0.5 microns, crystal defects may be increased and the production yield of the micro light-emitting device 100a may be reduced.

Referring to FIG. 1A and FIG. 2A simultaneously, the light guide structure 120 of the micro light-emitting device 100a of the present embodiment has a first surface 120b and a second surface 120t opposite to each other, wherein the first surface 120b is in contact with the first-type semiconductor layer 114. In order to improve the light-emitting efficiency of the micro light-emitting device 100a, the root mean square roughness of the first surface 120b of the light guide structure 120 is greater than the root mean square roughness of the second surface 120t, so that photons are less likely to be confined by the light guide structure 120, thus improving the light-emitting efficiency of the micro light-emitting device 100a. Furthermore, the top surface 110t of the first-type semiconductor layer 114 may further distinguish a first portion 110t1 and a second portion 110t2, wherein the light guide structure 120 is in contact with the first portion 110t1. Herein, the root mean square roughness of the second portion 110t2 is greater than the root mean square roughness of the first portion 110t1, that is, the roughness of the surface of the first-type semiconductor layer 114 in contact with the light guide structure 120 is smaller than the roughness of the surface of the light guide structure 120 not in contact with the first-type semiconductor layer 114. As a result, a good connection force between the light guide structure 120 and the first-type semiconductor layer 114 may be achieved, thereby improving production yield.

Moreover, the refractive index of the light guide structure 120 of the micro light-emitting device 100a is smaller than the refractive index of the first-type semiconductor layer 114. Herein, the material of the light guide structure 120 is, for example, silicon oxide or silicon nitride, but the invention is not limited thereto. Furthermore, the ratio of a thickness D120 of the light guide structure 120 to a thickness D100a of the micro light-emitting device 100a is, for example, greater than or equal to 0.01 and less than 0.3, thus preventing the light emission of the micro light-emitting device 100a from being affected.

Figure 2C:
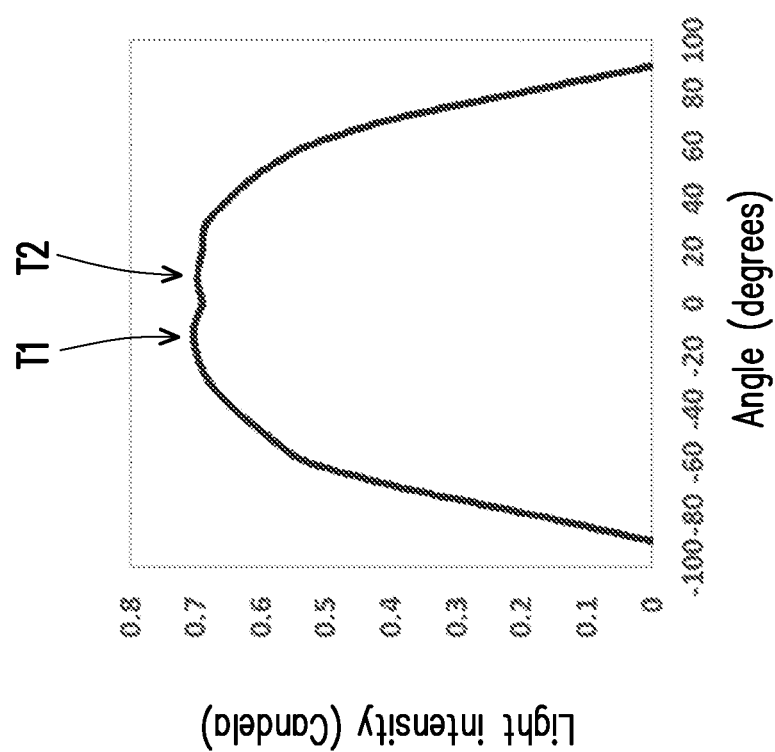
FIG. 2C is a distribution curve of angle and light intensity of the micro light-emitting device of FIG. 1 in a simulation experiment.

FIG. 2C is a distribution curve of angle and light intensity of the micro light-emitting device of FIG. 1 in a simulation experiment. It may be seen in the simulation experiment that, as shown in FIG. 2C, in the present embodiment, the design of the first grooves 112 and the second grooves 122 allows the micro light-emitting device 100a to have an approximately unimodal light distribution pattern. In detail, the light distribution pattern of the micro light-emitting device 100a may have two peaks, which are a first peak T1 and a second peak T2, respectively. Herein, the first peak T1 falls at an illumination angle of less than 0°, the second peak T2 falls at an illumination angle greater than 0°, and the first peak T1 and the second peak T2 both fall between an illumination angle of −30° and 30°. Thereby, the micro light-emitting device 100a may have the effect of concentrating light emission.

In short, in the design of the micro light-emitting device 100a of the present embodiment, the top surface 110t of the epitaxial structure layer 110 has the first grooves 112, and the light guide structure 120 covers a portion of the top surface 110t and the inner walls of a portion of the first grooves 112 to define the second grooves 122 corresponding to the portion of the first grooves 112. With this design, the light-emitting rate of the micro light-emitting device 100a may be effectively increased, thereby improving light-emitting efficiency.

It should be mentioned here that, the following embodiments adopt the reference numerals of the embodiments above and a portion of the content thereof, wherein the same reference numerals are used to represent the same or similar devices and descriptions of the same technical content are omitted. The omitted portions are as described in the embodiments above and are not repeated in the embodiments below.

Figure 3A:
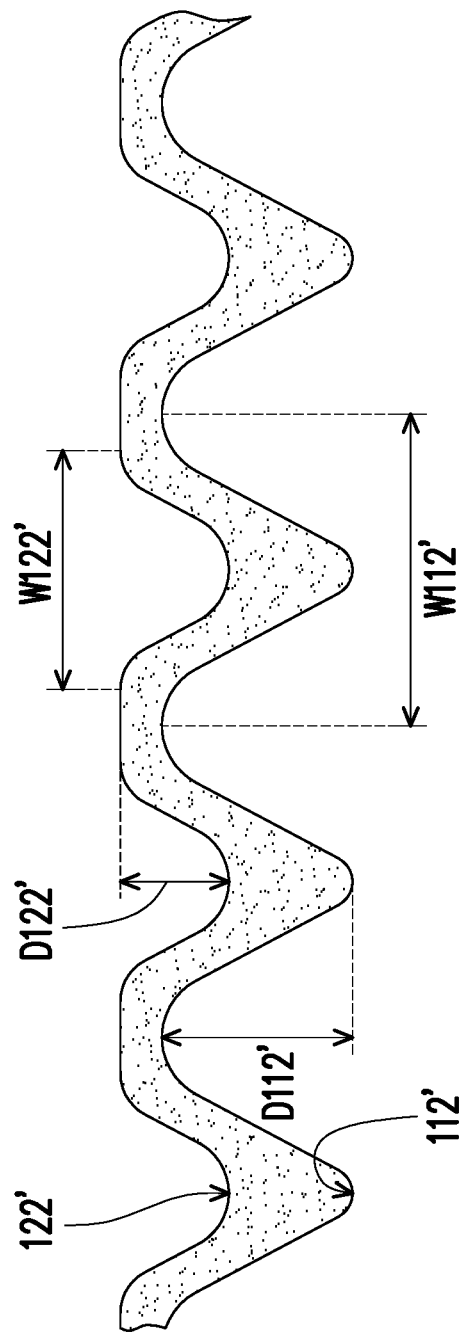
FIG. 3A is a partially enlarged view of first grooves and second grooves of another embodiment of the invention.

FIG. 3A is a partially enlarged view of first grooves and second grooves of another embodiment of the invention. Referring to FIG. 2B and FIG. 3A simultaneously, the difference between the two is that in the present embodiment, a first depth D112' of first grooves 112' is greater than a second depth D122' of corresponding second grooves 122', and a first width W112' of the first grooves 112' is greater than a second width W122' of the corresponding second grooves 122', whereby the connection force of a transfer device (not shown) and the second grooves 122' may be increased.

Figure 3B:
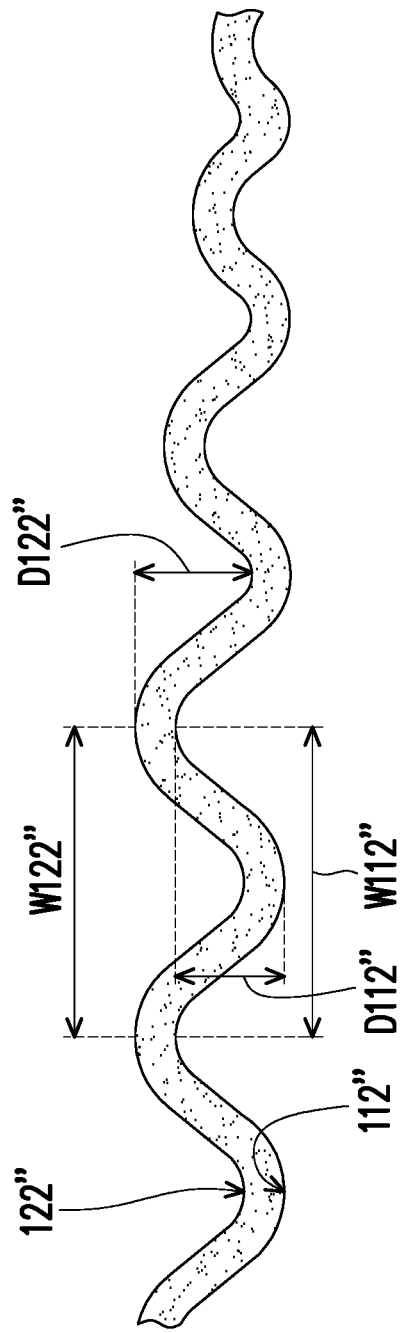
FIG. 3B is a partially enlarged view of first grooves and second grooves of another embodiment of the invention.

FIG. 3B is a partially enlarged view of first grooves and second grooves of another embodiment of the invention. Referring to FIG. 2B and FIG. 3B simultaneously, the difference between the two is that in the present embodiment, a first depth D112" of each of the first grooves 112" has a progressive change in a direction, and a second depth D122" of each of the corresponding second grooves 122" has the progressive change along the direction. In an embodiment, a rate of the progressive change is large than 0% and less or equal to 10%; that is, in the direction from left to right, the first depth D112" of each of the first grooves 112" and the second depth D122" of each of the corresponding second grooves 122" are gradually decreased. In addition, a first width W112" of each of the first grooves 112" has a progressive change in a direction, and a second width W122" of each of the corresponding second grooves 122" has the progressive change along the direction. In an embodiment, a rate of the progressive change is large than 0% and less or equal to 10%; that is, in the direction from left to right, the first width W112" of each of the first grooves 112" and the second width W122" of each of the corresponding second grooves 122" are gradually decreased. Thereby, the light emitting efficiency and yield of the micro light-emitting device can be improved.

Figure 4:
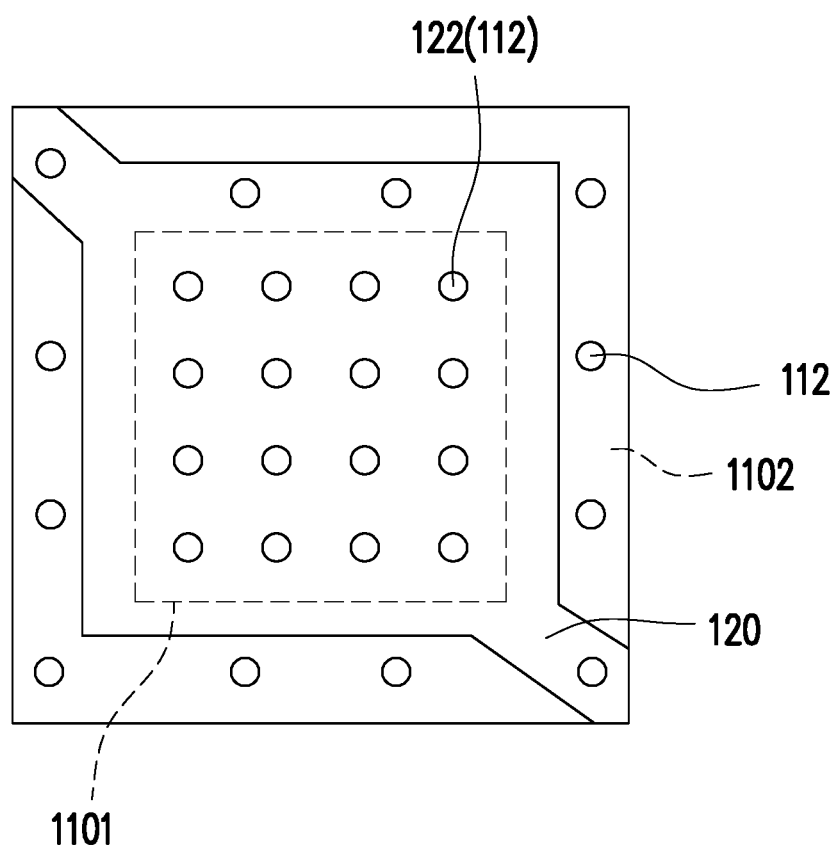
FIG. 4 is a top view of a micro light-emitting device of another embodiment of the invention.

FIG. 4 is a top view of a micro light-emitting device according to another embodiment of the invention. Referring to FIG. 1 and FIG. 4 simultaneously, a micro light-emitting device 100b is similar to the micro light-emitting device 100a, and the difference between the two is that in the present embodiment, the distribution density of the first grooves 112 of the micro light-emitting device 100b in the central region 1101 is greater than the distribution density thereof in the peripheral region 1102, and the ratio of the central region 1101 to the top surface 1102 is greater than or equal to 0.5, thereby effectively concentrating the light emission in the central region. At this time, the coverage of the light guide structure 120 covering the first grooves 112 in the central region 1101 is also greater than the coverage of the peripheral region 1102, whereby the micro light-emitting device 100b may have the effect of concentrating light emission. In particular, the projected area of the light guide structure 120 on the epitaxial structure layer 110 is greater than the projected area of the central region 1101 on the epitaxial structure layer 110, so that light-emitting effect is better, but the invention is not limited thereto.

Figure 5:
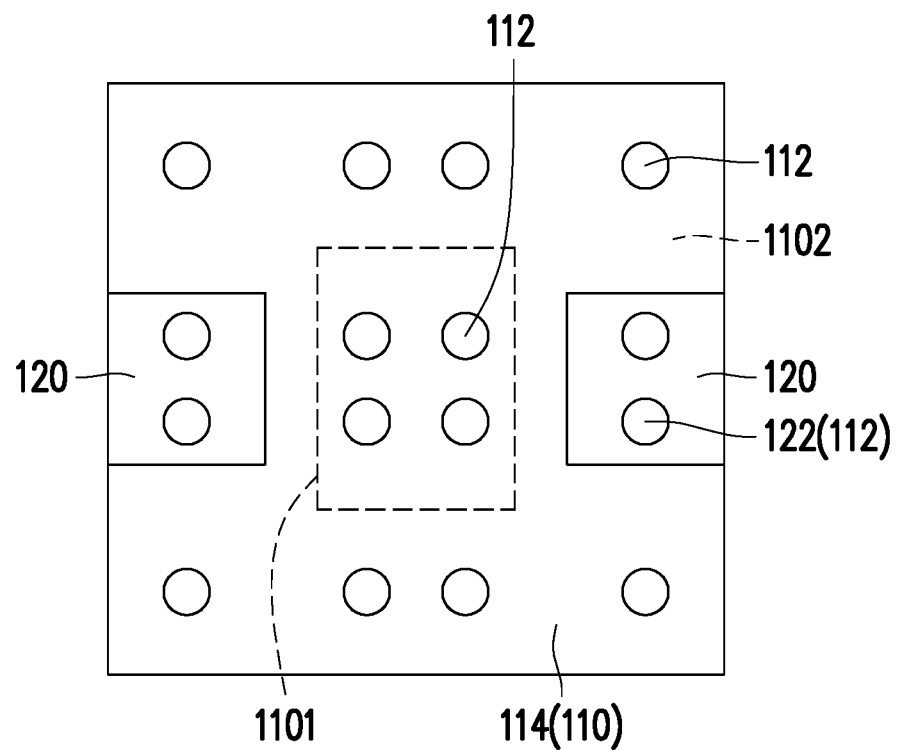
FIG. 5 is a top view of a micro light-emitting device of yet another embodiment of the invention.

FIG. 5 is a top view of a micro light-emitting device of yet another embodiment of the invention. Referring to FIG. 1 and FIG. 5 simultaneously, a micro light-emitting device 100c is similar to the micro light-emitting device 100a, and the difference between the two is that in the present embodiment, the coverage of the light guide structure 120 of the micro light-emitting device 100c in the peripheral region 1102 of the first-type semiconductor layer 114 is greater than the coverage thereof in the central region 1101, whereby the lateral light-emitting benefit of the micro light-emitting device 100b may be improved.

Figure 6:
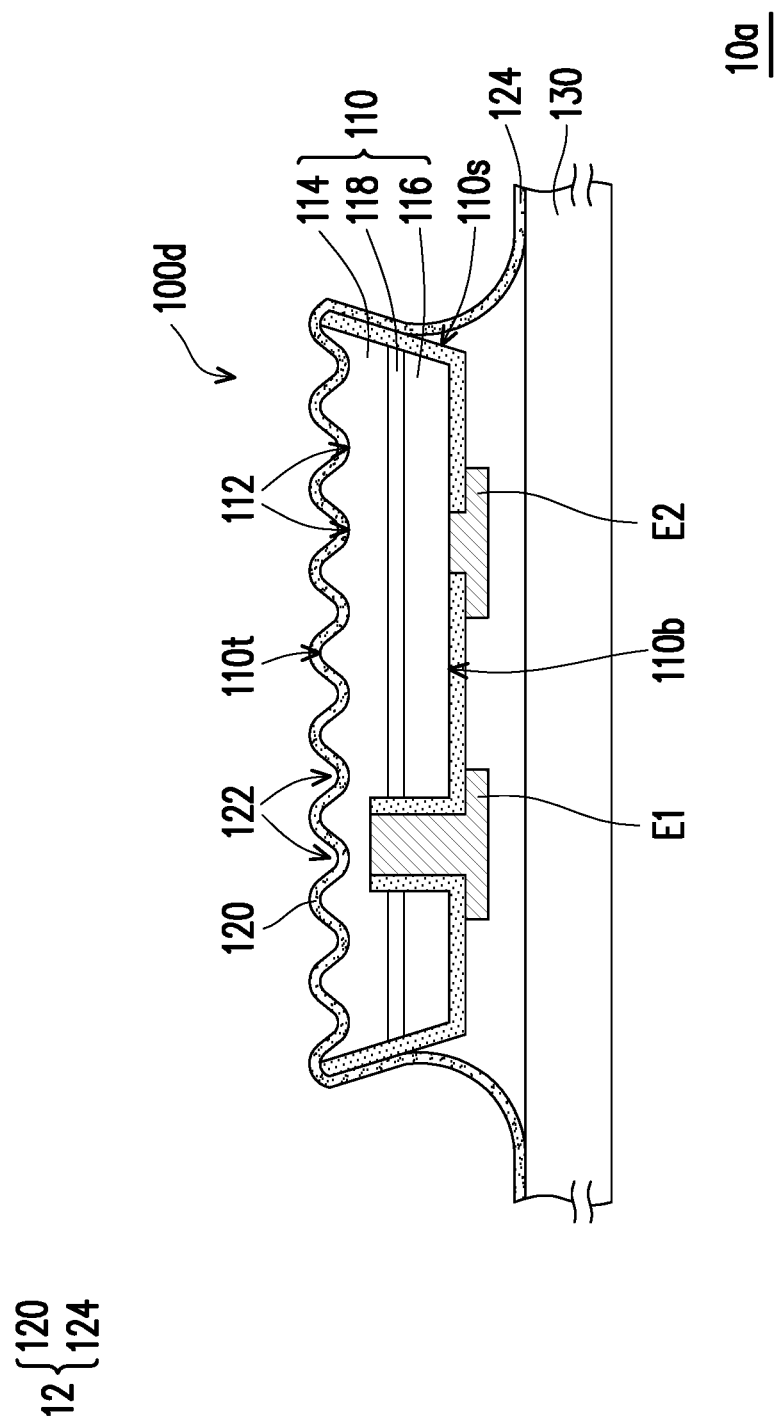
FIG. 6 is a cross section of a micro light-emitting device structure of an embodiment of the invention.

FIG. 6 is a cross section of a micro light-emitting device structure of an embodiment of the invention. Referring to FIG. 6, a micro light-emitting device structure 10a includes a substrate 130, at least one micro light-emitting device 100d (one of which is schematically shown in FIG. 6), and at least one holding structure 12 (one of which is schematically shown in FIG. 6). The micro light-emitting device 100d is disposed on the substrate 130 and has the top surface 110t and the bottom surface 110b opposite to each other, the plurality of first grooves 112 located at the top surface 110t, and the first-type electrode E1 and the second-type electrode E2 located at the bottom surface 110b and separated from each other. The holding structure 12 includes a light guide portion (i.e., the light guide structure 120) and a holding portion 124. The light guide portion (i.e., the light guide structure 120) is disposed on the micro light-emitting device 100d and covers a portion of the top surface 110t and the inner walls of a portion of the first grooves 112 to define the second grooves 122 corresponding to the portion of the first grooves 110, and the holding portion 124 is connected to the light guide portion (i.e., the light guide structure 120) and extended onto the substrate 130. More specifically, after a subsequent transfer, the holding portion 124 of the holding structure 12 is removed, leaving the light guide portion, that is, the light guide structure 120 such as the micro light-emitting device 100a.

Herein, the substrate 130 of the present embodiment is a carrier substrate, and the material thereof is, for example, a temporary substrate such as a plastic substrate, a glass substrate, or a sapphire substrate, and may be fixed and have a flat surface, but is not limited thereto. The micro light-emitting device 100d has a peripheral surface 110s connected to the top surface 110t and the bottom surface 110b. Herein, as shown in FIG. 6, the holding portion 124 of the holding structure 12 is directly in contact with the peripheral surface 110s and is not in contact with the first-type electrode E1 and the second-type electrode E2, thereby avoiding damage to the first-type electrode E1 and the second-type electrode E2 and reducing the production yield of the micro light-emitting device 100d during the subsequent transfer of the micro light-emitting device 100d. In addition, the first-type electrode E1 and the second-type electrode E2 of the micro light-emitting device 100d of the present embodiment are both not directly in contact with the substrate 130, thereby avoiding possible influence on the first-type electrode E1 and the second-type electrode E2 in a subsequent process in order to maintain the production yield of the micro light-emitting device 100d, but the invention is not limited thereto.

Figure 7:
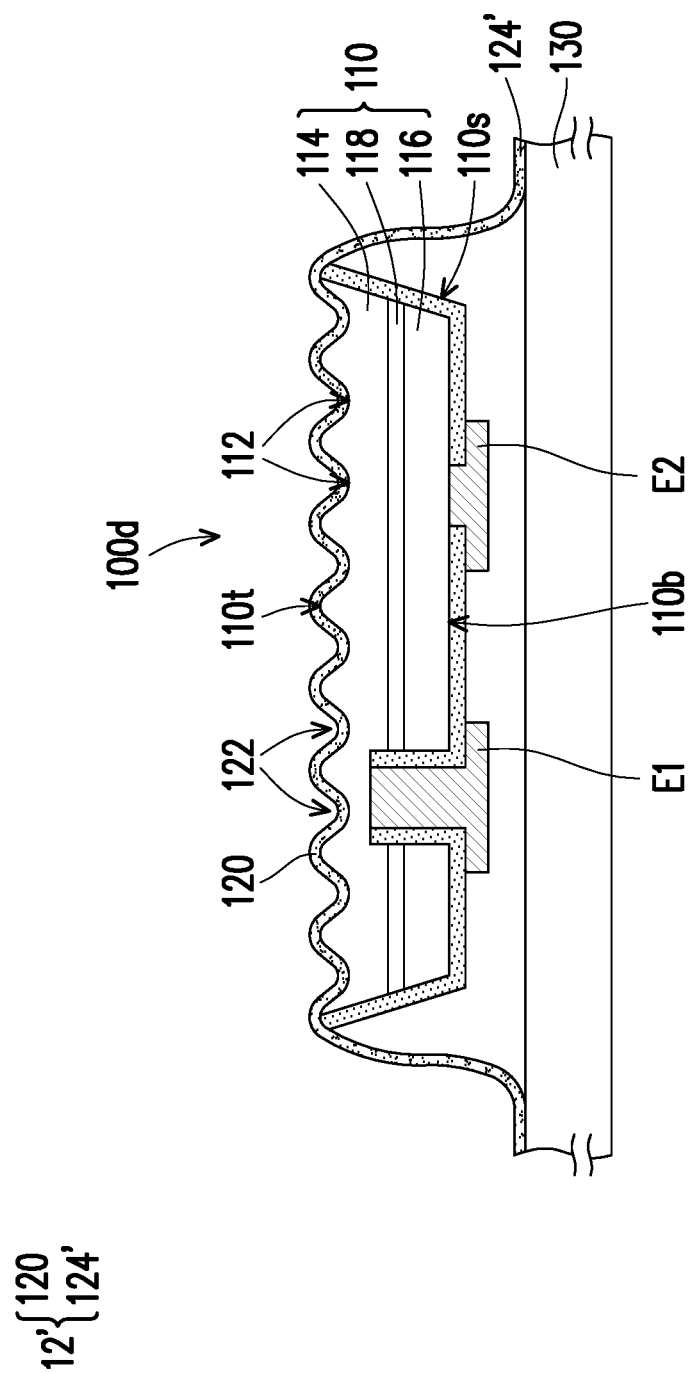
FIG. 7 is a cross section of a micro light-emitting device structure of another embodiment of the invention.

FIG. 7 is a cross section of a micro light-emitting device structure of another embodiment of the invention. Referring to FIG. 6 and FIG. 7 simultaneously, a micro light-emitting device structure 10b is similar to the micro light-emitting device 10a, and the difference between the two is that in the present embodiment, a holding portion 124' of a holding structure 12' of the micro light-emitting device structure 10b is not in contact with the peripheral surface 110s, such that the fixing force of the holding structure 12' thereof to the micro light-emitting device 100c may be further reduced, so that the external force required for subsequent transportation and transfer of the micro light-emitting device 100d may be reduced, thus further reducing the probability of damaging the micro light-emitting device 100d and improving the production yield of the micro light-emitting device 100d, but the invention is not limited thereto.

Figure 8:
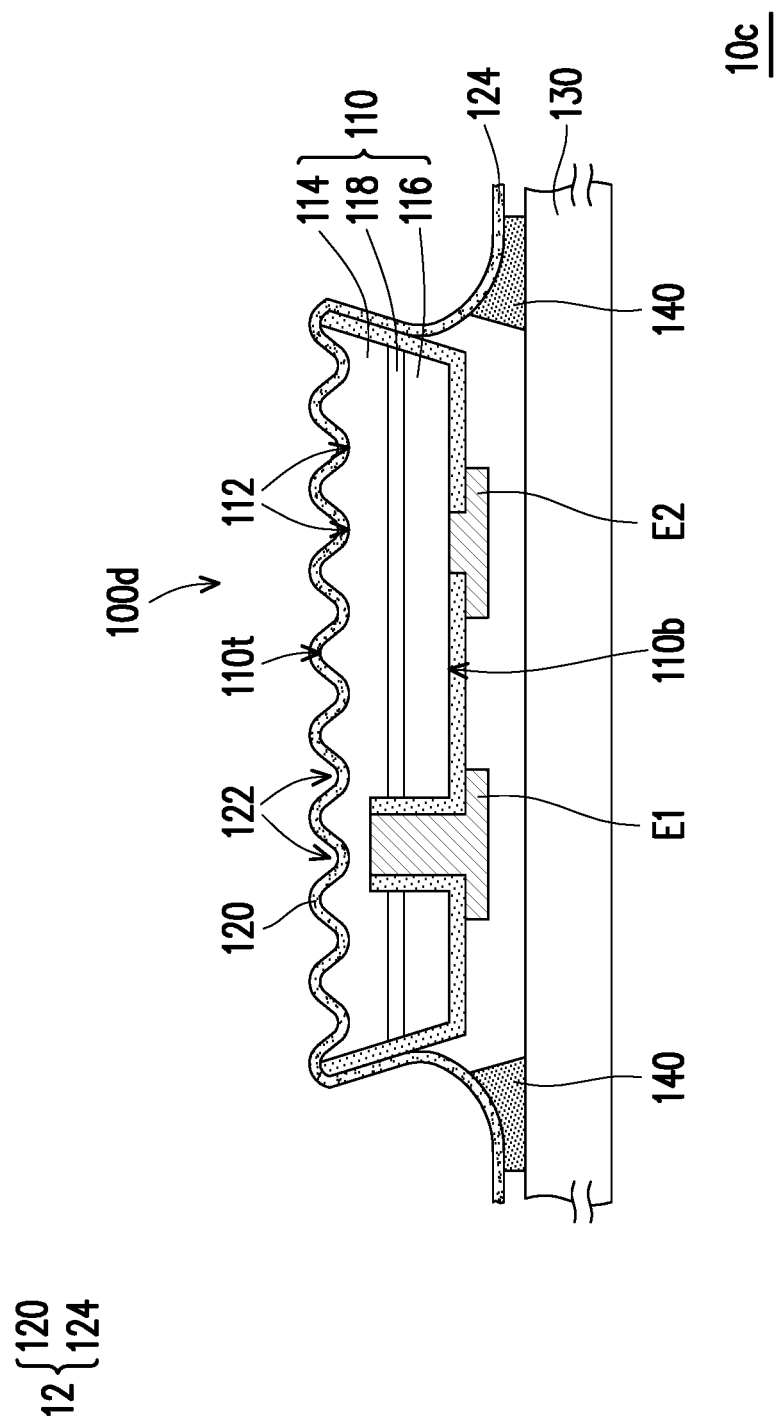
FIG. 8 is a cross section of a micro light-emitting device structure of yet another embodiment of the invention.

FIG. 8 is a cross section of a micro light-emitting device structure of another embodiment of the invention. Referring to FIG. 6 and FIG. 8 simultaneously, a micro light-emitting device structure 10c is similar to the micro light-emitting device 10a, and the difference between the two is that in the present embodiment, the micro light-emitting device structure 10c further includes a buffer layer 140, wherein the buffer layer 140 is disposed between the micro light-emitting device 100d and the substrate 130 and directly in contact with the holding portion 124 of the holding structure 12 and the substrate 130. That is, the holding structure 12 and the micro light-emitting device 100d of the present embodiment are not directly in contact with the substrate 130, but are connected to the substrate 130 via the buffer structure 140. Herein, the material of the buffer structure 140 may include a foaming material or an organic polymer material, and has a buffer function, and the absorbing holding structure 12 is affected by an external force when the micro light-emitting device 100d is held for transportation and transfer, thereby further improving the pick-up yield and production yield of the micro light-emitting device 100d during transportation and transfer, but the invention is not limited thereto.

Figure 9:
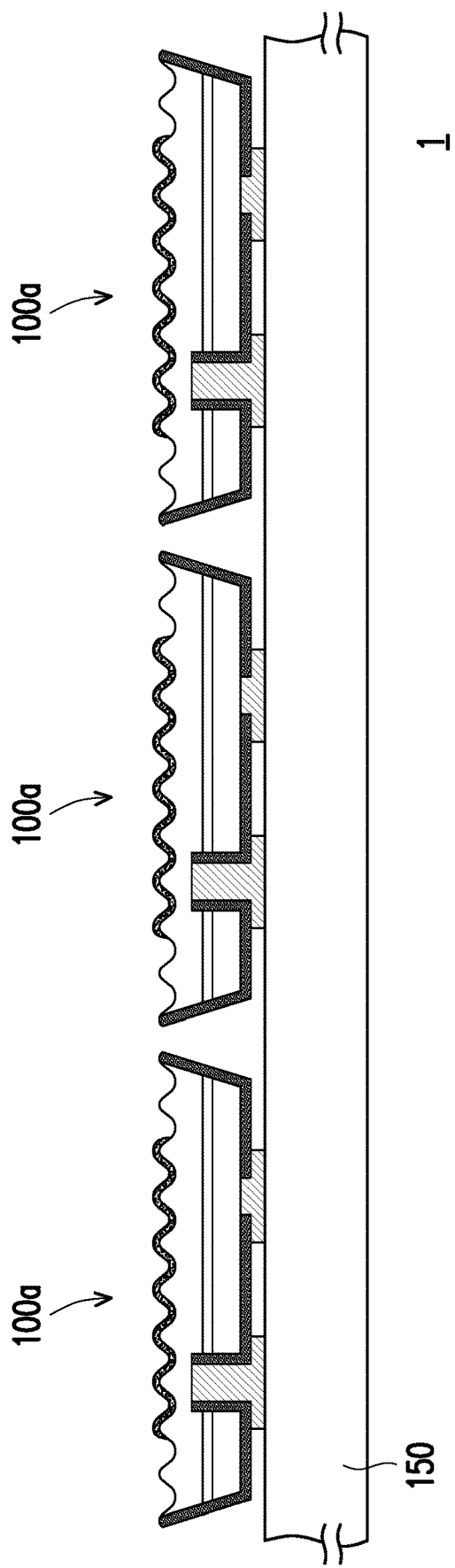
FIG. 9 is a cross section of a micro light-emitting device display of an example of the invention.

FIG. 9 is a cross section of a micro light-emitting device display of an example of the invention. A micro light-emitting device display 1 of the present embodiment includes a circuit substrate 150 and a plurality of the micro light-emitting device 100a (refer to FIG. 1, FIG. 2A, and FIG. 2B), wherein the micro light-emitting devices 100a are disposed on the circuit substrate 150. Herein, the circuit substrate 150 of the present embodiment is, for example, a complementary metal-oxide-semiconductor (CMOS) substrate, a liquid crystal-on-silicon (LCOS) substrate, a thin-film transistor (TFT) substrate, or other substrates having a working circuit, and is not limited herein.

In short, in the micro light-emitting device display 1 of the present embodiment, the light-emitting efficiency of the micro light-emitting device 100a is improved by the epitaxial structure layer 110 having the first grooves 112 and the second grooves 122 of the light guide structure 120 conformally disposed on the first grooves 112, thereby improving the display quality thereof.

Based on the above, in the design of the micro light-emitting device of the invention, the light guide structure has the second grooves corresponding to a portion of the first grooves of the epitaxial structure layer. With this design, the light-emitting efficiency of the micro light-emitting device may be effectively improved, and the display quality of the micro light-emitting device display using the micro light-emitting device may be improved. In addition, in the holding structure of the micro light-emitting device structure of the invention, the light guide portion is disposed on the micro light-emitting device and covers a portion of the top surface and the inner walls of a portion of the first grooves to define the second grooves corresponding to the portion of the first grooves, thereby increasing the light-emitting efficiency of the micro light-emitting device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A micro light-emitting device, comprising:
   an epitaxial structure layer having a top surface and a bottom surface opposite to each other and a plurality of first grooves located on the top surface;
   a first-type electrode disposed on the epitaxial structure layer and located at the bottom surface;
   a second-type electrode separated from the first-type electrode and disposed on the epitaxial structure layer and located at the bottom surface; and
   a light guide structure disposed on the epitaxial structure layer and covering a portion of the top surface and a portion of inner walls of the first grooves to define a plurality of second grooves corresponding to the portion of the first grooves,
   wherein the top surface has a central region and a peripheral region surrounding the central region, the light guide structure fully covers the central region of the top surface, and a coverage of the light guide structure in the central region is greater than a coverage of the light guide structure in the peripheral region.

2. The micro light-emitting device as claimed in claim 1, wherein the epitaxial structure layer comprises:
   a first-type semiconductor layer electrically connected to the first-type electrode and having the top surface;
   a second-type semiconductor layer electrically connected to the second-type electrode; and
   a light-emitting layer located between the first-type semiconductor layer and the second-type semiconductor layer, wherein the top surface of the first-type semiconductor layer is relatively far from the light-emitting layer.

3. The micro light-emitting device as claimed in claim 2, wherein a ratio of a depth of each of the first grooves to a thickness of the first-type semiconductor layer is greater than or equal to 0.05 and less than or equal to 0.3.

4. The micro light-emitting device as claimed in claim 2, wherein the light guide structure has a first surface and a second surface opposite to each other, the first surface is in contact with the first-type semiconductor layer, and a root mean square roughness of the first surface is greater than a root mean square roughness of the second surface.

5. The micro light-emitting device as claimed in claim 2, wherein the top surface of the first-type semiconductor layer has a first portion and a second portion, the light guide structure is in contact with the first portion, and a root mean square roughness of the second portion is greater than a root mean square roughness of the first portion.

6. The micro light-emitting device as claimed in claim 1, wherein a ratio of a depth of each of the first grooves to an emission wavelength of the micro light-emitting device is between 0.5 and 3, a ratio of a width of each of the first grooves to the emission wavelength of the micro light-emitting device is between 0.5 and 4, and a ratio of a spacing between any two adjacent first grooves to the emission wavelength of the micro light-emitting device is between 1 and 5.

7. The micro light-emitting device as claimed in claim 1, wherein a first depth of each of the first grooves is greater than a second depth of each of the corresponding second grooves, and a first width of each of the first grooves is greater than a second width of each of the corresponding second grooves.

8. The micro light-emitting device as claimed in claim 1, wherein a first depth of each of the first grooves and a second depth of each of the corresponding second grooves are both greater than or equal to 10 nm and less than or equal to 1500 nm.

9. The micro light-emitting device as claimed in claim 1, wherein a first width of each of the first grooves and a second width of each of the corresponding second grooves are both greater than or equal to 250 nm and less than or equal to 2.5 microns.

10. The micro light-emitting device as claimed in claim 1, wherein a first spacing of any two adjacent first grooves and a second spacing of any two adjacent second grooves are both less than or equal to 2.5 microns and greater than or equal to 0.5 microns.

11. The micro light-emitting device as claimed in claim 1, wherein a cross-sectional shape of each of the first grooves comprises an arc shape, a cone shape, or a platform shape.

12. The micro light-emitting device as claimed in claim 1, wherein depths of adjacent first grooves are different.

13. The micro light-emitting device as claimed in claim 1, wherein the top surface has the central region and the peripheral region surrounding the central region, and a distribution density of the first grooves in the central region of the top surface is greater than a distribution density thereof in the peripheral region.

14. The micro light-emitting device as claimed in claim 1, wherein the second grooves are conformally disposed with the corresponding first grooves.

15. The micro light-emitting device as claimed in claim 1, wherein a first depth of each of the first grooves has a progressive change in a direction, and a second depth of each of the corresponding second grooves has the progressive change along the direction.

16. The micro light-emitting device as claimed in claim 15, wherein a rate of the progressive change is large than 0% and less or equal to 10%.

17. The micro light-emitting device as claimed in claim 1, wherein a first width of each of the first grooves has a progressive change in a direction, and a second width of each of the corresponding second grooves has the progressive change along the direction.

18. The micro light-emitting device as claimed in claim 17, wherein a rate of the progressive change is from larger than 0% and less or equal to 10%.

19. The micro light-emitting device as claimed in claim 1, wherein an orthographic projection area of the light guide structure on the epitaxial structure layer is greater than an orthographic projection area of the central region on the epitaxial structure layer.

20. A micro light-emitting device structure, comprising:
a substrate;
at least one micro light-emitting device disposed on the substrate and having a top surface and a bottom surface opposite to each other, a plurality of first grooves located on the top surface, and a first-type electrode and a second-type electrode located at the bottom surface and separated from each other; and
at least one holding structure comprising at least one light guide portion and at least one holding portion, wherein the light guide portion is disposed on the micro light-emitting device and covers a portion of the top surface and a portion of inner walls of the first grooves to define a plurality of second grooves corresponding to the portion of the first grooves, and the holding portion is connected to the light guide portion and extended onto the substrate,
wherein the top surface has a central region and a peripheral region surrounding the central region, the light guide portion fully covers the central region of the top surface, and a coverage of the light guide portion in the central region is greater than a coverage of the light guide portion in the peripheral region.

21. The micro light-emitting device as claimed in claim 20, wherein an orthographic projection area of the light guide portion on the micro light-emitting device is greater than an orthographic projection area of the central region on the micro light-emitting device.

22. A micro light-emitting device display, comprising:
a circuit substrate; and
at least one micro light-emitting device disposed on the circuit substrate, and the micro light-emitting device comprises:
an epitaxial structure layer having a top surface and a bottom surface opposite to each other and a plurality of first grooves located on the top surface;
a first-type electrode disposed on the epitaxial structure layer and located at the bottom surface, wherein the first-type electrode is electrically connected to the circuit substrate;
a second-type electrode separated from the first-type electrode and disposed on the epitaxial structure layer and located at the bottom surface, wherein the second-type electrode is electrically connected to the circuit substrate; and
a light guide structure disposed on the epitaxial structure layer and covering a portion of the top surface and a portion of inner walls of the first grooves to define a plurality of second grooves corresponding to the portion of the first grooves,
wherein the top surface has a central region and a peripheral region surrounding the central region, the light guide structure fully covers the central region of the top surface, and a coverage of the light guide structure in the central region is greater than a coverage of the light guide structure in the peripheral region.

23. The micro light-emitting device as claimed in claim 22, wherein an orthographic projection area of the light guide structure on the epitaxial structure layer is greater than an orthographic projection area of the central region on the epitaxial structure layer.

* * * * *